United States Patent
Kim et al.

(10) Patent No.: US 9,291,662 B2
(45) Date of Patent: Mar. 22, 2016

(54) DEVICE AND METHOD FOR DETECTING INSERTION DIRECTION OF SIM CARD

(71) Applicant: Samsung Electronics Co., Ltd, Gyeonggi-do (KR)

(72) Inventors: Kyung-Up Kim, Gyeongsangbuk-do (KR); Je-Hyun Son, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 146 days.

(21) Appl. No.: 14/137,898

(22) Filed: Dec. 20, 2013

(65) Prior Publication Data

US 2014/0176154 A1    Jun. 26, 2014

(30) Foreign Application Priority Data

Dec. 20, 2012    (KR) .......................... 10-2012-0149580

(51) Int. Cl.
  *G06K 7/00*    (2006.01)
  *G01R 31/04*    (2006.01)
(52) U.S. Cl.
  CPC ............ *G01R 31/041* (2013.01); *G06K 7/0069* (2013.01)

(58) Field of Classification Search
  CPC ................ G06K 7/0021; G06K 13/08; G06K 19/007749; B42D 15/10; G07F 7/1008
  USPC .......................................... 235/441, 492, 487
  See application file for complete search history.

(56) References Cited

U.S. PATENT DOCUMENTS

2007/0026892 A1*    2/2007   Neuhaus et al. .............. 455/558

FOREIGN PATENT DOCUMENTS

JP    2000-3415    1/2000

* cited by examiner

*Primary Examiner* — Karl D Frech

(57) ABSTRACT

Disclosed are a device and a method for detecting a reversed insertion of the SIM card into a SIM card socket unit in the terminal. The device includes a SIM card socket unit including a detection terminal that is disposed at a position to be contacted with a GND terminal of the SIM card, and when the SIM card is inserted, and outputs a voltage received from a contacted terminal of the SIM card. The SIM card socket unit having received the voltage from the detection terminal is transmitted to a controller as a SIM card insertion direction detection signal. When the SIM card insertion direction detection signal received from the SIM card socket unit is a reversed insertion detection signal, the controller is configured to inform the user that the SIM card is inserted in a reversed direction.

24 Claims, 4 Drawing Sheets

DEVICE AND METHOD FOR DETECTING INSERTION DIRECTION OF SIM CARD

CROSS-REFERENCE TO RELATED APPLICATION(S) AND CLAIM OF PRIORITY

The present application is related to and claims the priority under 35 U.S.C. §119(a) to Korean Application No. 10-2012-0149580, which was filed in the Korean Intellectual Property Office on Dec. 20, 2012, the entire content of which is hereby incorporated by reference.

TECHNICAL FIELD

The present disclosure relates generally to a device and method of detecting insertion direction of a SIM card in a terminal, and more particularly, to a SIM card insertion direction detection device and method capable of detecting a reversed insertion of the SIM card into a SIM card socket unit in a terminal.

BACKGROUND

In order to prevent a reversed insertion of a SIM card when the SIM card is inserted into a terminal, a push-push type SIM card is configured such that the reversed insertion is mechanically prevented by a SIM card socket unit of the terminal. In addition, a socket type SIM card is configured such that when the SIM card is inserted into a SIM card socket unit of the terminal in the reversed direction, the reversed insertion can be visually discriminated using the asymmetry of the SIM card.

However, as the size of a SIM card is reduced, the asymmetry portion in a socket type SIM card is also reduced. As a result, it becomes difficult to visually discriminate whether or not the SIM card is reversely inserted into the SIM card socket unit of the terminal.

Also in case of a push-push type SIM card, as the size of the SIM card is reduced, it is expected that a mechanical design that allows the reversed insertion of the SIM card into the SIM card socket unit of the terminal to be detected may become very difficult, and even if such a design is enabled, the reversed insertion of the SIM card may not be confirmed when the reversed insertion of the SIM card is forcibly performed.

SUMMARY

To address the above-discussed deficiencies of the prior art, it is a primary object to provide at least the advantages described below.

Another aspect of the present disclosure is to provide a device and method for detecting a reversed insertion of the SIM card into a SIM card socket unit in a terminal.

Yet another aspect of the present disclosure is to provide a device and method capable of informing a user of a reason why a SIM card inserted into the SIM card socket unit of the terminal is not recognized.

Yet another aspect of the present disclosure is to provide a device and method capable of detecting the insertion direction of a SIM card regardless of the type of the SIM card inserted into the SIM card socket unit of the terminal.

In accordance with the above-described aspects of the present disclosure, there is provided a device for detecting the insertion direction of a SIM card in a terminal. The device includes a SIM card socket unit including a detection terminal that is disposed at a position to be contacted with a GND terminal of the SIM card, and when the SIM card is inserted, outputs a voltage received from the GND terminal of the SIM card, and a controller. The SIM card socket unit is configured to transmit the voltage output from the detection terminal to a controller as a SIM card insertion direction detection signal. In addition, the controller configured to determine if the SIM card is inserted in a reversed insertion based on the SIM card direction detection signal, and inform the user that the SIM card is inserted in a reversed direction upon determining as reversed insertion.

In addition, there is also provided a method for detecting the insertion direction of a SIM card in a terminal. The method includes receiving a voltage from a GND terminal of the SIM card through a detection terminal of a SIM card socket unit when the detection terminal of the SIM card socket unit comes into contact with the GND terminal of the SIM card as the SIM card is inserted into the SIM card socket unit in the terminal, producing a SIM card insertion direction detection signal according to the received voltage from the detection terminal, and informing the user that the SIM card is inserted in a reversed direction when the SIM card insertion direction detection signal indicates reversed insertion.

According to the device and method for detecting the insertion direction of a SIM card in a terminal, a reversed insertion of a SIM card with a symmetrical structure may be detected, and the user may be informed of the reversed insertion of the SIM card. In addition, since the user may be informed of the reason why the SIM card inserted into a SIM card socket unit of a terminal is not recognized, the user may be aware whether the SIM card is not recognized due to a failure of the SIM card or due to the reversed insertion of the SIM card.

Before undertaking the DETAILED DESCRIPTION OF THE DISCLOSURE below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
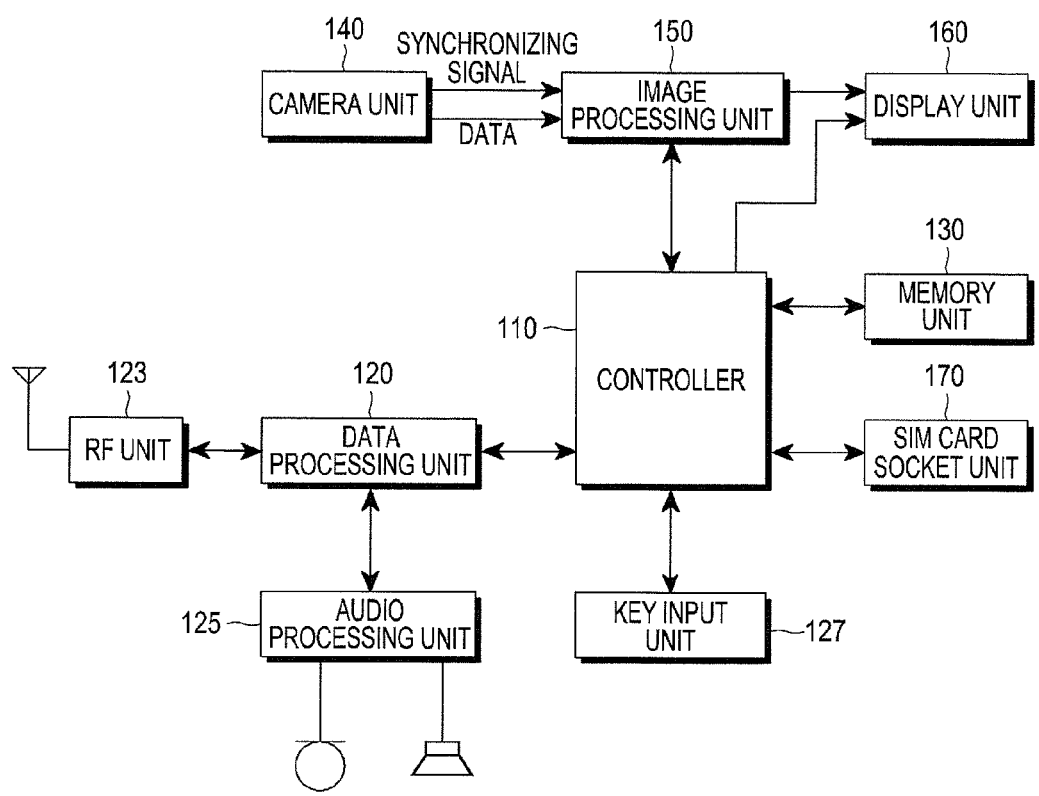
FIG. 1 is a schematic view illustrating a configuration of a terminal according to an exemplary embodiment of the present disclosure.

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic devices. Hereinafter, various embodiments of the present disclosure will be described with reference to the accompanying drawings. It shall be noted that in the following description, the same elements will be designated by the same reference numerals although they are shown in different drawings.

The terminal according to the exemplary embodiment of the present disclosure includes a portable terminal and a fixed terminal. Here, the portable terminal is an electronic device that is movable to be easily carried, which can be, for example, a video phone, a mobile phone, a smart phone, an IMT-2000 (International Mobile Telecommunication 2000) terminal, a WCDMA terminal, a UMTS (Universal Mobile Telecommunication Service) terminal, a PDA (Personal Digital Assistant), a PMP (Portable Multimedia Player), a DMB (Digital Multimedia Broadcasting) terminal, an E-Book, a portable computer (for example, a notebook computer or a tablet computer), or a digital camera. In addition, the fixed terminal can be, for example, a desktop personal computer.

Figure 2:
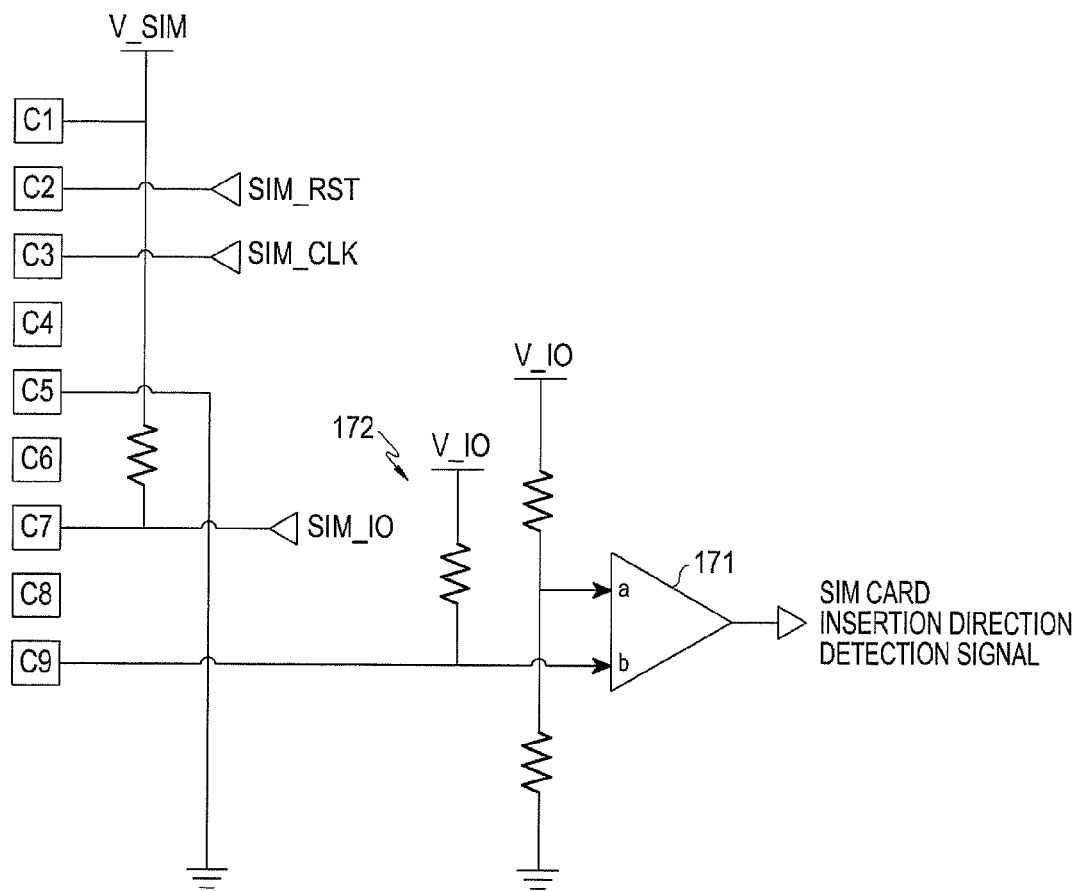
FIG. 2 is a circuit diagram of a SIM card socket unit of the terminal according to the exemplary embodiment of the present disclosure.

FIG. 1 is a schematic view illustrating a configuration of a terminal according to an exemplary embodiment of the present disclosure, and FIG. 2 is a circuit diagram of a SIM card socket unit of the terminal according to the exemplary embodiment of the present disclosure.

Referring to FIG. 1, an RF unit 123 performs a wireless communication function of a terminal. The RF unit 123 includes: a RF transmitter that performs up-conversion and amplification of the frequency of a transmitted signal; and an RF receiver that performs low noise amplification of a received signal down-converts and down-conversion of the frequency of the received signal. A data processing unit 120 includes: a transmitter that performs coding and modulation of the transmitted signal; and a receiver that performs demodulation and decoding of the received signal. That is, the data processing unit 120 can be configured by a modem and a codec. Here, the codec includes a data codec that processes packet data and an audio codec that processes an audio signal such as voice. The audio processing unit 125 performs a function of reproducing an audio signal output from the audio codec of the data processing unit 120 or a function of transmitting a transmitted audio signal produced from a microphone to the audio codec of the data processing unit 120.

The key input unit 127 includes keys for inputting numerical and letter information and function keys for setting various functions.

A memory unit 130 can be composed of a program memory and a data memory. The program memory can store programs for controlling general operations of the terminal, and programs for conducting a control for detecting the insertion direction of a SIM card into a SIM card socket unit. In addition, the data memory performs a function of temporarily storing data produced while the programs are being executed.

A controller 110 performs a function of controlling the entire operations of the terminal.

According to an exemplary embodiment of the present disclosure, when a SIM card insertion direction detection signal received from the SIM card socket unit 170 is a reversed insertion detection signal, the controller 110 performs a control to inform the user that the SIM card is inserted reversely.

At this time, the controller 110 can perform a control such that a vibration is generated or a popup window is displayed on a display unit that informs the user that the SIM card is inserted reversely.

In addition, according to an exemplary embodiment of the present disclosure, when the SIM card insertion direction detection signal received from the SIM card socket unit 170 is a correct insertion detection signal, the controller 110 determines that the SIM card is correctly inserted and performs a control such that a recognition operation for the SIM card is performed.

At this time, when the SIM card correctly inserted into the SIM card socket unit 170 is not recognized, the controller 110 performs a control such that a vibration is generated or a popup window is displayed on the display unit 160 that informs the user that the SIM card is in a failed condition.

The SIM card is inserted into the SIM card socket unit 170 which includes a plurality of terminals that can come into contact with a plurality of terminals of the SIM card when the SIM card is inserted.

According to an exemplary embodiment of the present disclosure, the plurality of terminals of the SIM card socket unit 170 include a detection terminal for detecting the reversed insertion of the SIM card.

The detection terminal is arranged at a position where it can come into contact with a GND terminal of the SIM card inserted into the SIM card socket unit 170, and a voltage output from the detection terminal is transmitted to the controller 110 as a SIM card insertion direction detection signal.

FIG. 2 illustrates a circuit diagram of the SIM card socket unit 170. With reference to FIG. 2, the SIM card socket unit includes a plurality of terminals C1-C9. Terminal C1 is a power terminal, terminal C2 is a SIM card resetting terminal, terminal C3 is a SIM card clock terminal, and terminal C4 is a spare terminal that is not used. In addition, terminal C5 is a GND terminal, terminal C6 is a no connection terminal, terminal C7 is a data in/out terminal, and terminal C8 is a spare terminal that is not used.

Also, terminal C9 added for the present disclosure is a detection terminal for detecting the insertion direction of the SIM card. The detection terminal C9 comes into contact with the GND terminal of the inserted SIM card, and the voltage received from the contacted GND terminal is distributed by a predetermined voltage by a pull up resistance unit 172, and then transmitted to a comparison unit 171.

The comparison unit 171 compares the voltage output from the detection terminal C9 with a reference voltage, and depending on the result of comparison, transmits the reversed insertion detection signal or the correct insertion detection signal to the controller 110 as the SIM card insertion direction detection signal.

The reference voltage a is set as a value larger than a "0" voltage and smaller than the voltage output from the detection terminal.

When it is determined that the voltage b of the detection terminal C9 is higher than the reference voltage a as the result of comparing the voltage b output from the detection terminal C9 and the reference voltage a, the comparison unit 171 can output "High" as the reversed insertion detection signal.

In addition, when it is determined that the voltage b of the detection terminal C9 is lower than the reference voltage a as the result of comparing the voltage b output from the detection terminal C9 and the reference voltage a, the comparison unit 171 can output "Low" as the reversed insertion detection signal.

A camera unit 140 includes a camera sensor that photographs image data and converts a photographed optical signal into an electric signal, and a signal processing unit that converts an analog image signal photographed by the camera sensor into a digital data. Here, it is assumed that the camera sensor is a CCD or a CMOS sensor, and the signal processing unit can be implemented as a DSP (Digital Signal Processor). In addition, the camera sensor and the signal processing unit can be integrally implemented or separately implemented.

The image processing unit 150 performs an ISP (Image Signal Processing) for displaying the image signal output from the camera unit 140 on the display unit 160, and the ISP performs various functions, for example, a gamma correction, an interpolation, a spatial change, an image effect, an image scaling, an AWB, an AE, and an AF. Accordingly, the image processing unit 150 processes the image signal output from the camera unit 140 by the frame, and outputs the frame image data to be suitable to the characteristic and size of the display unit 160. In addition, the image processing unit 150 includes an image codec, and performs a function to compress the frame image data displayed on the display unit 160 by a preset method, or to restore the compressed frame image date to the original frame image data. Here, the image codec can be, for example, a JPEG codec, an MPEG4 codec, or a Wavelet codec. It is assumed that the image processing unit 150 has an OSD (On Screen Display) function, in which the image processing unit can output OSD data according to the size of the screen to be displayed under the control of the controller 110.

The display unit 160 displays the image signal output from the image processing unit 150 as a screen, and displays the user data output from the controller 110. Here, the display unit 160 can use an LCD, in which case the display unit 160 can include, for example, a memory that can store LCD controller image data and an LCD display device. Here, when the LCD is implemented as a touch screen type, the display unit 160 can be operated as an input unit, in which case the keys for the key input unit 127 can be displayed on the display unit 160.

In addition, when the display unit 160 is used as a touch screen unit as the display unit 160 is implemented as a touch screen type, the touch screen unit is formed by a TSP (Touch Screen Panel) including a plurality of sensor panels, and the plurality of sensor panels can include a capacitive sensor panel that can recognize a hand touch, and a electromagnetic sensor panel that can sense a detailed touch, for example, by using a touch pen.

In addition, according to an exemplary embodiment of the present disclosure, when the SIM card is reversely inserted into the SIM card socket unit 170, the display unit 160 displays the reversed insertion of the SIM card through a popup window.

In addition, according to an exemplary embodiment of the present disclosure, when the SIM card correctly inserted into the SIM card socket unit 170 is not recognized, the display unit 160 displays a popup window that informs the user that the SIM card is in a failed condition.

The operations for detecting the insertion direction of the SIM card in the terminal as described above will be described in detail with reference to FIGS. 3 to 5.

Figure 3:
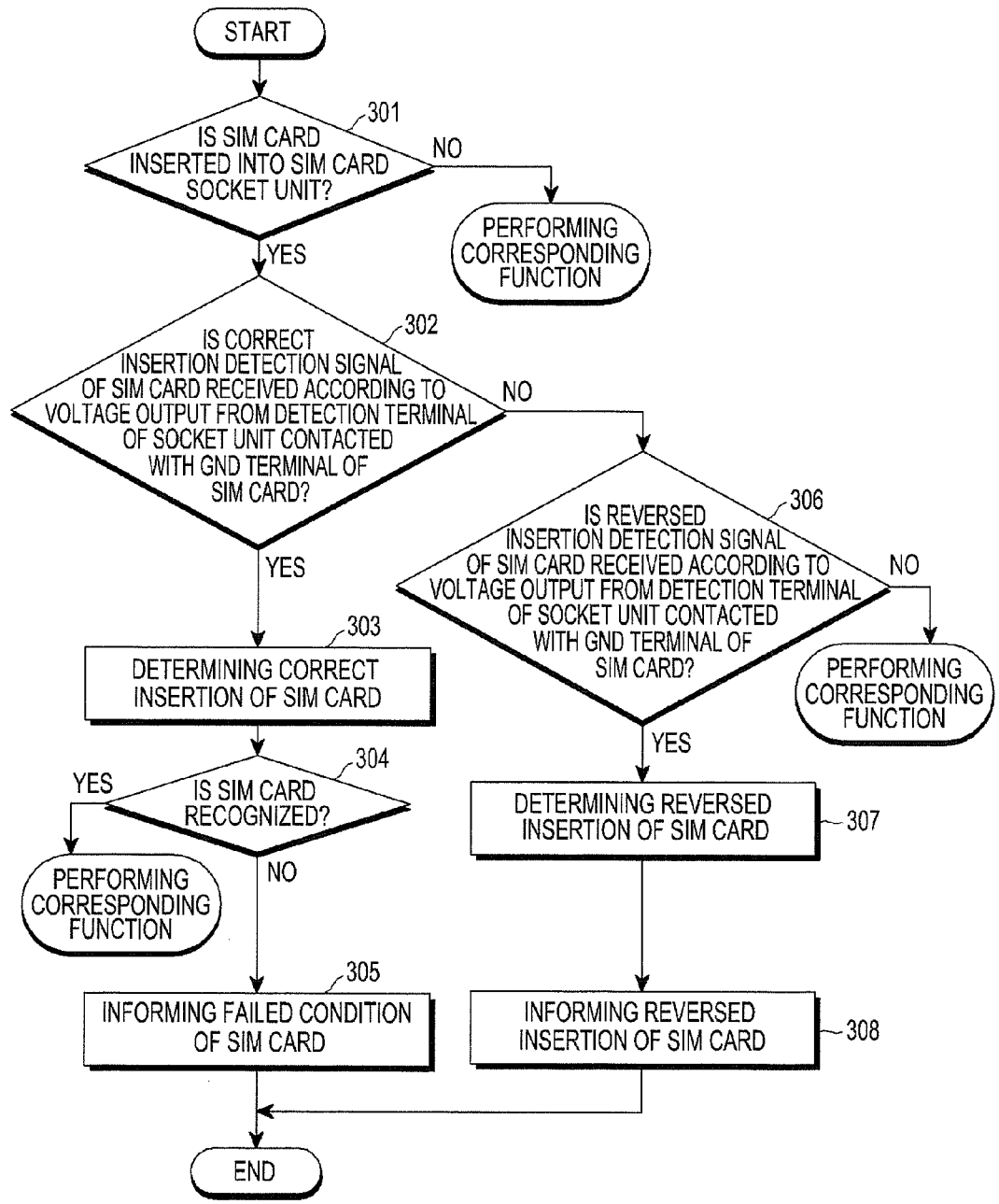
FIG. 3 is a flowchart illustrating a process of detecting the insertion direction of the SIM card in the terminal according to the exemplary embodiment of the present disclosure.
Figure 4:
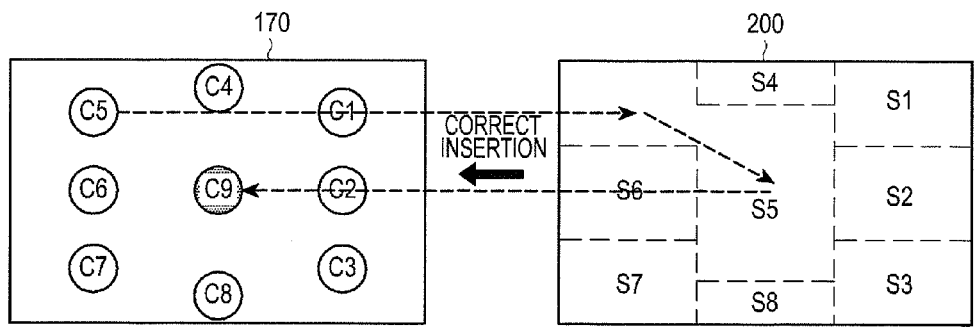
FIG. 4 is a schematic view for describing a correct insertion of the SIM card in the terminal according to the exemplary embodiment of the present disclosure.
Figure 5:
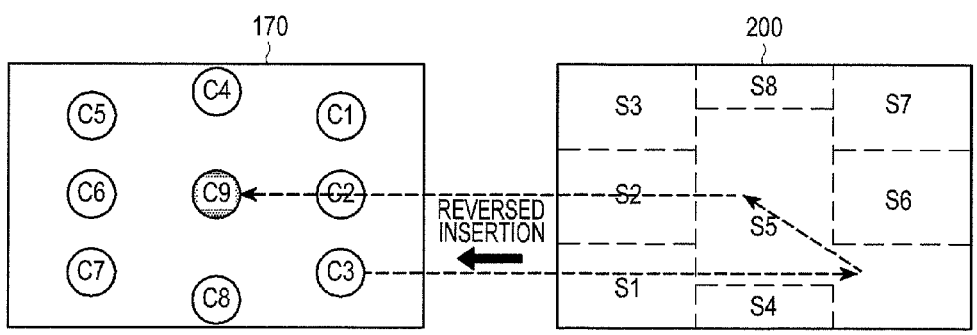
FIG. 5 is a schematic view for describing a reversed insertion of the SIM card in the terminal according to the exemplary embodiment of the present disclosure.

FIG. 3 is a flowchart illustrating a process of detecting the insertion direction of the SIM card in the terminal according to the exemplary embodiment of the present disclosure, FIG. 4 is a schematic view for describing a correct insertion of the SIM card in the terminal according to the exemplary embodiment of the present disclosure, and FIG. 5 is a schematic view for describing a reversed insertion of the SIM card in the terminal according to the exemplary embodiment of the present disclosure.

In the following detailed description of the exemplary embodiment of the present disclosure, FIGS. 1 and 2 are also referred.

Referring to FIG. 3, when the SIM card is inserted into the SIM card socket unit 170, the controller 110 senses this in step 301. The controller 110 awaits the reception for a SIM card insertion direction detection signal output from the SIM card socket unit 170.

When the SIM card is inserted, the plurality of terminals of the SIM card and the plurality of terminals of the SIM card socket unit 170 come into contact with each other.

In that event, when the GND terminal and the detection terminal among the plurality of terminals of the SIM card socket unit 170 are concurrently contacted with the GND terminal among the plurality of terminals of the SIM card, i.e., when the SIM card is inserted into the SIM card socket unit 170 in the correct direction, the voltage "0" of the GND terminal of the SIM card socket unit 170 is output to the detection terminal of the SIM card socket unit 170 through the GND terminal of the SIM card.

Accordingly, when voltage "0" is output from the detection terminal, the comparison unit 171 compares the voltage "0" output from the detection terminal C9 with the reference voltage, and since the voltage "0" output from the detection terminal C9 is lower than the reference voltage, the correct insertion signal of the SIM card is output to the controller 110. The reference voltage has a value larger than the "0" voltage and smaller than the voltage output from the detection terminal.

When the correct insertion detection signal is received from the SIM card socket unit 170, the controller 110 senses this in step 302, determines the correct insertion of the SIM card in step 303, and performs a SIM card recognition operation.

In that event, when the SIM card correctly inserted into the SIM card socket unit 170 is not recognized, the controller 110 senses this in step 304, and conducts step 305 in which an operation is performed to inform the user of the failed condition of the SIM card by generating a vibration or displaying a popup window.

Referring to FIG. 4 that illustrates the state where the SIM card 200 is inserted into the SIM card socket unit 170 in the correct direction by way of an example, when the SIM card 200 is inserted into the SIM card socket unit 170 in the correct direction, the GND terminal C5 and the detection terminal C9 of the SIM card socket unit 170 come into contact with the GND terminal S5 of the SIM card 200.

Accordingly, as the GND terminal C5 and the detection terminal C9 are connected with each other through the GND terminal S5 of the SIM card 200, the voltage "0" of the GND terminal C5 of the SIM card socket unit 170 is transmitted to the detection terminal C9 of the SIM card socket unit through the GND terminal S5 of the SIM card 200, and hence the detection terminal C9 transmits the voltage "0" to the comparison unit 171.

As it is determined that the voltage "0" output from the detection terminal C9 is lower than the reference voltage (that has a value larger than the voltage "0") as the result of comparison by the comparison unit 171, when the "Low" signal is output to the controller 110 as the correct insertion detection signal, the controller 110 senses this and performs a recognition operation for the inserted SIM card.

Meanwhile, when a specific terminal other than the GND terminal and the detection terminal among the plurality of terminals of the SIM card socket unit 170 come into contact with the GND terminal among the plurality of terminals of the SIM card, i.e., when the SIM card is inserted into the SIM card socket unit 170 in the reversed direction, the voltage of the specific terminal of the SIM card socket unit 170 is output to the detection terminal of the socket 170 through the GND terminal of the SIM card. Since all the plurality of terminals of the SIM card socket unit 170 except the GND terminal apply a driving voltage or are connected to the controller 110, the voltage of the specific terminal has a value equal to or larger than "0".

In addition, the voltage output through the detection terminal is distributed to a predetermined value through the pull up resistance unit 172, and then output to the comparison unit 171. The predetermined value output from the detection terminal C9 through the comparison unit 171 and the reference voltage are compared with each other, and as the predetermined voltage output from the detection terminal C9 is higher than the reference voltage, the reversed insertion detection signal is output to the controller 110. The reference voltage has a value larger than the "0" voltage, and smaller than the voltage output from the detection terminal.

When the reversed insertion detection signal is received from the SIM card socket unit 170, the controller 110 senses this in step 306, and conducts step 307 in which it is determined that at present, the SIM card is inserted into the SIM card socket unit 170 in the reversed direction. Then, the controller 110 performs an operation to inform the user of the reversed insertion of the SIM card by generating a vibration or displaying a popup window in step 308.

Referring to FIG. 5 that illustrates the state where the SIM card 200 is inserted into the SIM card socket unit 170 in the reversed direction by way of an example, when the SIM card 200 is inserted into the SIM card socket unit 170 in the reversed direction, a specific terminal C3 and the detection terminal C9 of the SIM card socket unit 170 come into contact with the GND terminal S5 of the SIM card 200.

Accordingly, as the specific terminal C3 and the detection terminal C9 are connected with each other through the GND terminal S5 of the SIM card, the voltage of the specific terminal C3 of the SIM card socket unit 170 is transmitted to the detection terminal C9 of the SIM card socket unit 170 through the GND terminal S5 of the SIM card, and the voltage output from the detection terminal C9 is distributed to a predetermined voltage through the pull up resistance unit 172 and then output to the comparison unit 171.

As the predetermined voltage of the detection terminal C9 is higher than the reference voltage as the result of comparison by the comparison unit 171, when the "High" signal is output to the controller 110 as the reversed insertion detection signal, the controller 110 senses this and performs an operation to inform the user of the reversed insertion by generating a vibration or displaying a popup window.

In the exemplary embodiment, the reference voltage is defined as a voltage higher than the "0" voltage and lower than the voltage output from the detection terminal.

However, the voltage output from the detection terminal can be set in such a manner that when the SIM card is inserted in the reversed direction, the voltage is varied depending on the type of the controller connected with a specific terminal contacted with the GND terminal of the SIM card, except the GND terminal among the plurality of terminals of the SIM card socket unit.

As described above, the present disclosure allows the reversed insertion of the SIM card regardless the type and size of the SIM card merely by adding a separate terminal to the SIM card socket unit of the terminal and using a circuit configuration of a comparator.

The inventive device and method for detecting the insertion direction of a SIM card in a terminal can be implemented by computer-readable codes in a computer-readable recoding medium. The computer-readable recording medium includes all the types of recording devices in which data readable by a computer system are stored. As for such a recording medium, for example, a ROM, a RAM, an optical disc, a magnetic tape, a floppy disc, a hard disc, or a non-volatile memory can be used, and a medium implemented in a type of carrier wave (for example, transmission through the Internet) can also be included in such a recording medium. In addition, the computer-readable recording medium can be stored with codes which are distributed in computer systems connected by a network such that the codes can be read and executed by a computer in a distributed method.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A portable terminal, comprising:
a SIM card socket unit including a detection terminal disposed at a position to be in contact with a GND terminal of the SIM card when the SIM card is inserted, the detection terminal configured to receive a voltage from a contacted terminal of the SIM card, and the SIM card socket unit configured to transmit the voltage from the detection terminal to a controller as a SIM card insertion direction detection signal; and
the controller configured to determine if the SIM card is inserted in a reversed insertion based on the SIM card direction detection signal, and inform a user that the SIM card is inserted in the reversed direction upon determining that the SIM card is inserted in the reversed insertion,
wherein when receiving the reversed insertion detection signal from the SIM card socket unit, the controller is configured to generate a vibration or display a popup window on a display unit to inform the user that the SIM card is inserted in the reversed direction.

2. The portable terminal of claim 1, wherein when the GND terminal of the SIM card contacts the GND terminal and the detection terminal among the plurality of terminals provided in the SIM card socket unit, the voltage of the GND terminal of the SIM card socket unit is output to the detection terminal, and
when the GND terminal of the SIM card contacts a specific terminal other than the GND terminal and the detection terminal among the plurality of terminals provided in the SIM card socket unit, the voltage of the specific terminal is output to the detection terminal.

3. The portable terminal of claim 1, further comprising:
a comparison unit configured to compare the voltage output from the detection terminal with a reference voltage, and as a function of a result of comparison, transmit the SIM card insertion direction detection signal to the controller.

4. The portable terminal of claim 3, wherein the comparison unit is configured to output a reversed insertion detection signal when the voltage output from detection terminal is higher than the reference voltage, and output a correct insertion detection signal when the voltage output from detection terminal is lower than the reference voltage.

5. The portable terminal of claim 4, wherein the reference voltage is higher than a "0" voltage, and lower than the voltage output from the detection terminal.

6. The portable terminal of claim 1, wherein the SIM card socket unit includes a plurality of terminals configured to contact a plurality of terminals of the SIM card upon being inserted into the SIM card socket unit, and the detection terminal of the SIM card socket unit disposed at a position to be in contact with the GND terminal of the SIM card.

7. The portable terminal of claim 6, wherein the detection terminal of the SIM card socket unit is configured to contact the GND terminal of the SIM card when the SIM card is inserted in the correct direction, and
the detection terminal of the SIM card socket unit is configured to contact a specific terminal other than the GND terminal of the SIM card when the SIM card is inserted in the reversed direction.

8. The portable terminal device of claim 6, wherein the detection terminal of the SIM card socket unit is configured to contact the GND terminal of the SIM card regardless of the insertion direction of the SIM card.

9. The portable terminal of claims 1, wherein when a specific terminal other than the GND terminal of the SIM card socket unit contacts the detection terminal, the detection terminal is configured to output the voltage of the specific terminal, and if the voltage of the detection terminal is higher than a reference voltage, the comparison unit is configured to produce a reversed insertion detection signal.

10. The portable terminal of claim 1, wherein when the detection terminal of the SIM card socket unit contacts the GND terminal of the inserted SIM card, the detection terminal is configured to output the voltage of the GND terminal of the SIM card, and if it is determined that the voltage of the detection terminal is lower than a reference voltage, the comparison unit is configured to produce the correct insertion detection signal.

11. The portable terminal of claim 10, wherein the voltage of the GND terminal of the SIM card socket unit in contact with the GND terminal of the SIM card is "0".

12. The portable terminal of claim 1, wherein when the SIM card is not recognized after the correct insertion detection signal is received from the SIM card socket unit, the controller is configured to generate vibration to inform the user an insertion failure of the SIM card.

13. A method for detecting the insertion direction of a SIM card in a portable terminal, the method comprising:
receiving a voltage from a terminal of the SIM card through a detection terminal of a SIM card socket unit when the SIM card is inserted into the SIM card socket unit in the portable terminal;
producing a SIM card insertion direction detection signal as a function of the received voltage; and
informing the user that the SIM card is inserted in a reversed direction when the SIM card insertion direction detection signal indicates the reversed insertion of the SIM card,
wherein informing the user further comprises generating a vibration or displaying a popup window on a display unit to inform the user that the SIM card has been inserted in the reversed direction.

14. The method of claim 13, wherein the detection terminal is disposed at a position where it is configured to contact the GND terminal of the SIM card.

15. The method of claim 13, wherein the step of receiving the voltage comprises:
when a GND terminal of the SIM card contacts a specific terminal other than the GND terminal and the detection terminal of the SIM card socket unit, outputting the voltage of the specific terminal through the detection terminal; and
when the GND terminal of the SIM card contacts the GND terminal and the detection terminal of the SIM card socket, outputting the voltage of the GND terminal of the SIM card socket through the detection terminal.

16. The method of claim 15, wherein the voltage of the GND terminal of the SIM card socket unit in contact with the GND terminal of the SIM card is "0".

17. The method of claim 13, wherein the step of producing the SIM card insertion direction detection signal comprises:
comparing the voltage output from the detection terminal with a reference voltage;
when the voltage output from the detection terminal is higher than the reference voltage, outputting the reversed insertion detection signal; and
when the voltage output from the detection terminal is lower than the reference voltage, outputting a correct insertion detection signal.

18. The method of claim 17, wherein the reference voltage is higher than a "0" voltage and lower than the voltage output from the detection terminal.

19. The method of claim 13, wherein the step of producing the SIM card insertion direction detection signal comprises:
comparing the voltage of the detection terminal with a reference voltage; and
when the voltage of the detection terminal is higher than the reference voltage, outputting the reversed insertion detection signal.

20. The method of claim 19, wherein the voltage of the GND terminal of the SIM card socket unit in contact with the GND terminal of the SIM card is "0".

21. The method of claim 13, wherein the step of outputting the SIM card insertion direction detection signal comprises:
comparing the voltage of the detection terminal with a reference voltage; and
when the voltage of the detection terminal is lower than the reference voltage, outputting the correct insertion detection signal.

22. The method of claim 21, further comprising:
when the correct insertion detection signal is received, performing an operation for recognizing the SIM card; and
when the reverse insertion detection signal is received, generating a vibration or displaying a popup window on a display unit to inform a failed insertion of the SIM card.

23. A portable terminal comprising:
a SIM card socket unit including a detection terminal disposed at a position to be in contact with a GND terminal of the SIM card when the SIM card is inserted, the detection terminal configured to receive a first voltage from a contacted terminal of the SIM card, and the SIM card socket unit configured to transmit a second voltage from the detection terminal to a controller as a SIM card insertion direction detection signal; and the controller configured to:
- determine if the SIM card is inserted in a reversed insertion based on the SIM card direction detection signal, and
- inform a user that the SIM card is inserted in the reversed direction upon determining that the SIM card is inserted in the reversed insertion, by generating a vibration or displaying a message on a display unit.

24. A method for detecting the insertion direction of a SIM card in a portable terminal, the method comprising:
- receiving a voltage from a terminal of the SIM card through a detection terminal of a SIM card socket unit when the SIM card is inserted into the SIM card socket unit in the portable terminal;
- producing a SIM card insertion direction detection signal as a function of the received voltage; and
- informing the user that the SIM card is inserted in a reversed direction when the SIM card insertion direction detection signal indicates the reversed insertion of the SIM card, by generating a vibration or displaying a message on a display unit.

* * * * *